(12) United States Patent
Hatanaka et al.

(10) Patent No.: US 10,863,629 B2
(45) Date of Patent: Dec. 8, 2020

(54) METHOD OF MANUFACTURING THROUGH HOLE OF SUBSTRATE

(71) Applicant: FUJITSU LIMITED, Kawasaki (JP)

(72) Inventors: Kiyoyuki Hatanaka, Kawasaki (JP); Shigeru Sugino, Edogawa (JP); Takahiro Kitagawa, Kawasaki (JP); Ryo Kanai, Kawasaki (JP); Nobuo Taketomi, Kodaira (JP); Mitsunori Abe, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/513,896

(22) Filed: Jul. 17, 2019

(65) Prior Publication Data

US 2020/0037452 A1    Jan. 30, 2020

(30) Foreign Application Priority Data

Jul. 25, 2018   (JP) .................. 2018-139173

(51) Int. Cl.

| | |
|---|---|
| *H05K 3/06* | (2006.01) |
| *G03F 7/00* | (2006.01) |
| *H05K 3/42* | (2006.01) |
| *H05K 3/00* | (2006.01) |
| *G03F 7/26* | (2006.01) |
| *G03F 7/20* | (2006.01) |

(52) U.S. Cl.
CPC .......... *H05K 3/064* (2013.01); *G03F 7/0015* (2013.01); *H05K 3/0044* (2013.01); *H05K 3/42* (2013.01); *G03F 7/20* (2013.01); *G03F 7/26* (2013.01)

(58) Field of Classification Search
CPC ........ H05K 3/064; H05K 3/0044; H05K 3/42; H05K 3/0047; H05K 3/005; H05K 3/426; H05K 3/3447; H05K 2201/09854; G03F 7/0015; G03F 7/26; G03F 7/20
See application file for complete search history.

(56) References Cited

U.S. PATENT DOCUMENTS

2019/0014667 A1*  1/2019  Bahl ................. H05K 3/06

FOREIGN PATENT DOCUMENTS

JP       7-273449 A     10/1995

* cited by examiner

*Primary Examiner* — Nadine G Norton
*Assistant Examiner* — Mahmoud Dahimene
(74) *Attorney, Agent, or Firm* — Westerman, Hattori, Daniels & Adrian, LLP

(57) ABSTRACT

A method of manufacturing a through hole of a substrate includes forming, to the substrate, a cutting hole surrounding a removal-target-part such that a connection part of the substrate remains, the connection part that connects the removal-target-part that is removed from the substrate and a remaining part other than the removal-target-part that has been removed, along a cutting line of the through hole formed to the substrate; applying plating on an area including an inner peripheral wall face of the cutting hole of the substrate; applying a film covering an opening of the cutting hole on a surface of the substrate applied with the plating and performing exposure and development of the film to form an etching resist covering an area including the opening of the cutting hole; performing etching of the plating applied on the substrate; removing the etching resist; and cutting the connection part to remove the removal-target-part.

5 Claims, 11 Drawing Sheets

METHOD OF MANUFACTURING THROUGH HOLE OF SUBSTRATE

CROSS-REFERENCE TO RELATED APPLICATION

This application is based upon and claims the benefit of priority of the prior Japanese Patent Application No. 2018-139173, filed on Jul. 25, 2018, the entire contents of which are incorporated herein by reference.

FIELD

The embodiment discussed herein is related to a method of manufacturing a through hole of a substrate.

BACKGROUND

Conventionally, when manufacturing a printed wiring board, forming an etching resist using a photosensitive dry film and etching forms a conductor at a desired position to form an electric circuit.

Using a dry film for an etching resist is used also for manufacturing a print wiring board with through hole plating. In this case, a dry film is applied so as to cover an opening of a through hole provided with a substrate and having an inner peripheral wall face applied with plating, and a part of the dry film on which a conductor is formed is exposed, whereby developing processing is performed.

With this, the dry film is used for an etching resist with respect to the through hole, and when etching has been performed in a process after that, the plating may remain in the through hole. Such a method is referred to as a tenting method in some cases.

The thickness of a dry film that functions as an etching resist affects the finishing accuracy of wiring. For this reason, when a high-density circuit is formed on a printed wiring board, a dry film as thin as possible is desirably used. However, the thinner the dry film is, the more easily the dry film gets broken at the part where the opening of the through hole is covered. When broking the dry film for covering the opening of the through hole, an etching liquid, enters into the through hole through the broken part of the dry film. This may cause damage of the plating of the through hole. The larger the area of the opening of the through hole that is formed, the more easily such damage of the dry film may occur.

As a technique of possibly making the area of the opening of the through hole large while avoiding damage of the dry film, Japanese Laid-open Patent Publication No. 07-273449 is known, for example. Japanese Laid-open Patent Publication No. 07-273449 discloses a technique with which a plurality of round holes are provided with the base material of a printed wiring board, through hole plating is formed on the side face of each of the round holes, and then a slot connecting the round holes are provided using press working so that the slit width of the slot is narrower than the diameter of the round hole, whereby a slot through hole is formed. In this case, the dry film does not have to cover the entire area of the final slot through hole and only has to cover each of the round holes. This suppresses damage of the dry film.

SUMMARY

According to an aspect of the embodiments, a method of manufacturing a through hole of a substrate includes forming, to the substrate, a cutting hole surrounding a removal target part such that a connection part of the substrate remains, the connection part that connects the removal target part that is removed from the substrate and a remaining part other than the removal target part that has been removed, along a cutting line of through hole formed to the substrate; applying plating on an area including an inner peripheral wall face of the cutting hole of the substrate; applying a film covering an opening of the cutting hole on a surface of the substrate applied with the plating and performing exposure and development of the film to form an etching resist covering an area including the opening of the cutting hole; performing etching of the plating applied on the substrate; removing the etching resist; and cutting the connection part to remove the removal target part.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 10AB is an explanatory diagram illustrating another example in which the end part of the contour hole is bent toward the side apart from the removal target part;

FIG. 10BB is an explanatory diagram illustrating a state in which the removal target part has been removed from the state illustrated in FIG. 10AB and a through hole has been formed;

FIG. 10AC is an explanatory diagram illustrating still another example in which the end part of the contour hole is bent toward the side apart from the removal target part;

FIG. 10BC is an explanatory diagram illustrating a state in which the removal target part has been removed from the state illustrated in FIG. 10AC and a through hole has been formed;

DESCRIPTION OF EMBODIMENTS

Figure 1A:
FIGS. 1A to 1E each are an explanatory diagram illustrating in time series a part of a process included in a method of manufacturing a through hole of a substrate according to an embodiment.

For example, with Japanese Laid-open Patent Publication No. 07-273449, the inner peripheral wall face of a part connecting round holes is not applied with plating. With this, the ratio of an area applied with through hole plating is smaller than the area of the inner peripheral wall face of a slot through hole that is eventually formed.

Hereinafter, an embodiment of the present disclosure will be described with reference to the drawings. However, sizes, ratios, and the like of components illustrated in the drawings may not perfectly correspond to those in an actual case. Depending on the drawings, for the sake of explanation, some components present in an actual case may be omitted, and some components may have exaggerated sizes compared with those in an actual case. Specifically, FIGS. 1A to 1E and 2A to 2D each illustrate the cross section of a base material 2 of a circuit board 1 and schematically illustrate the arrangement of various components, with widths and thicknesses of the components being different from those in an actual case, for example.

First, in accordance with the process drawings in FIGS. 1A to 1E and 2A to 2D, a method of manufacturing a through hole of a substrate according to the embodiment will be described. In the descriptions of each process, FIGS. 3 to 7 will be referred to, as desired.

Figure 1B:
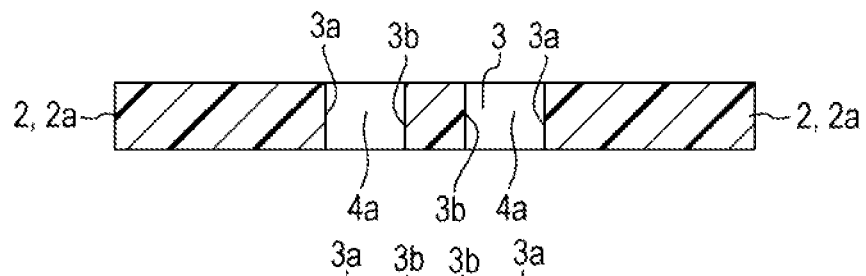

First, as illustrated in FIG. 1A, the base material 2 is prepared. As illustrated in FIG. 1B, a contour hole 3 is provided with the base material 2. The contour hole is referred to as a cutting hole. The base material 2 is a plate material that is able to form a rigid substrate. In the present embodiment, epoxy resin material is used for the base material 2. However, any resin material used for a rigid substrate, for example, a phenol resin material, may be used.

Figure 3:
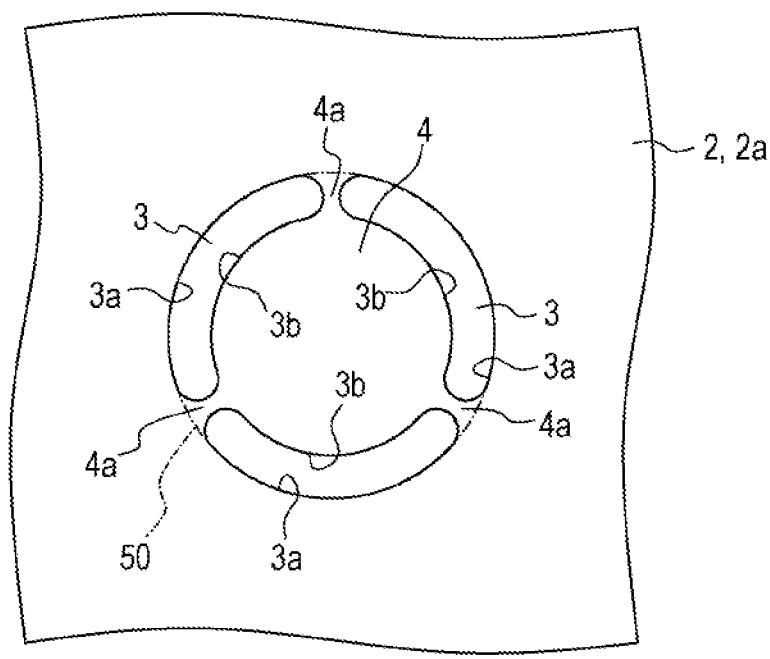
FIG. 3 is a plan view illustrating a contour hole formed to a base material.

In the present embodiment, the contour hole 3 is formed using a router. However, the contour hole 3 may be formed using a drill or a punching press. Referring to FIG. 3, the contour holes 3 are provided along a ring-shaped contour line 50 of through holes 13 formed to the base material 2 eventually (see FIG. 6B). More specifically, the contour holes 3 are provided so that outer edges 3a thereof are aligned with the contour line 50, for example. In the present embodiment, a round through hole 13 is formed eventually. The contour line 50 thus also is round, and along this round contour line 50, three contour holes 3 are provided. With the three contour holes 3 provided, a removal target part 4 which is surrounded by the contour holes 3 is formed. The removal target part 4 is removed from the base material 2 when the through hole 13 is formed.

The contour hole 3 according to the present embodiment is a long groove. The contour holes 3 each are bent so as to together form a round through hole 13.

The removal target part 4 is formed in a state connected to a remaining part 2a which remains after the removal target part 4 has been removed from the base material 2 through a connection part 4a. In the present embodiment, the contour hole 3 is formed so that three connection parts 4a remain. Thus, the remaining part 2a and the removal target part 4 are connected to each other through three connection parts 4a. An inner edge 3b of the contour hole 3 forms a part of the external form of the removal target part 4.

Figure 1C:
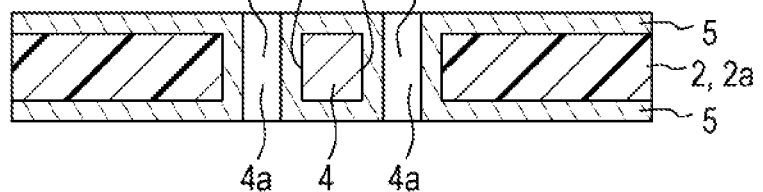
Figure 1D:
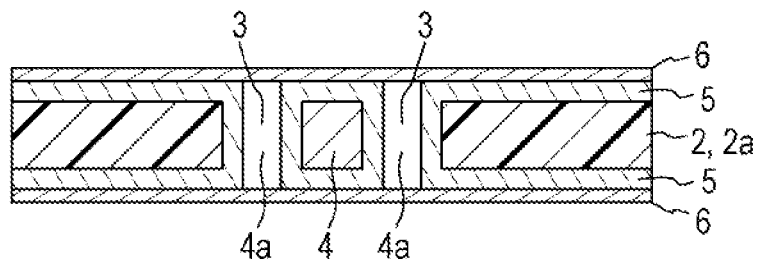

After the contour hole 3 is formed, as illustrated in FIG. 1C, plating 5 is applied on an area including the inner peripheral wall face of the contour hole 3 of the base material 2. In the present embodiment, copper plating is applied on the both faces of the base material 2 and the inner peripheral wall face of the contour hole 3. As illustrated in FIG. 1D, on the surfaces (both faces) of the base material 2 applied with the plating 5, a dry film 6 is applied to cover the opening of the contour hole 3. The dry film 6 has a photosensitive property and may be used in what is called a photolithography method. The dry film 6 is applied on the base material 2 applied with the plating 5. Attaching the dry film 6 may be performed using a known conventional method.

Figure 1E:
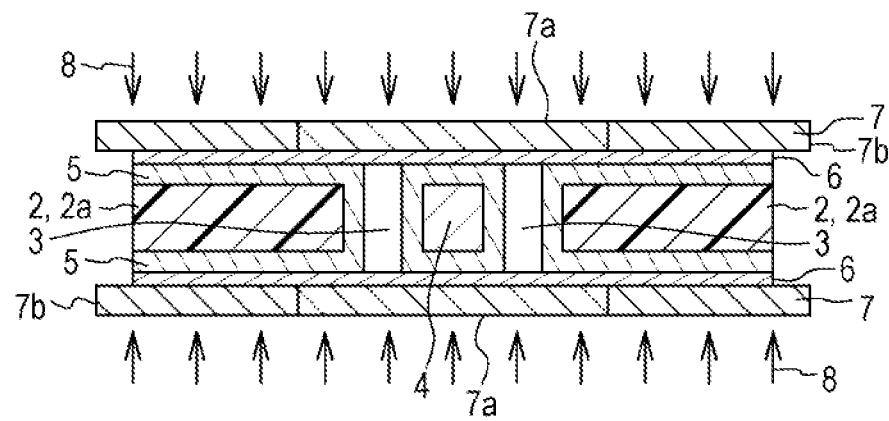

After the dry film 6 is applied, as illustrated in FIG. 1E, exposure of the dry film 6 is performed. At this time, a photomask 7 is overlaid on the dry film 6. The photomask 7 includes a light transmitting part 7a and a light shielding part 7b. In the present embodiment, the light transmitting part 7a is set to an area including the opening of the contour hole 3 and exposure is performed with an ultraviolet light 8 irradiated thereon. The dry film 6 at the exposed part is hardened. After the exposure is completed the photomask 7 is removed.

Figure 2A:
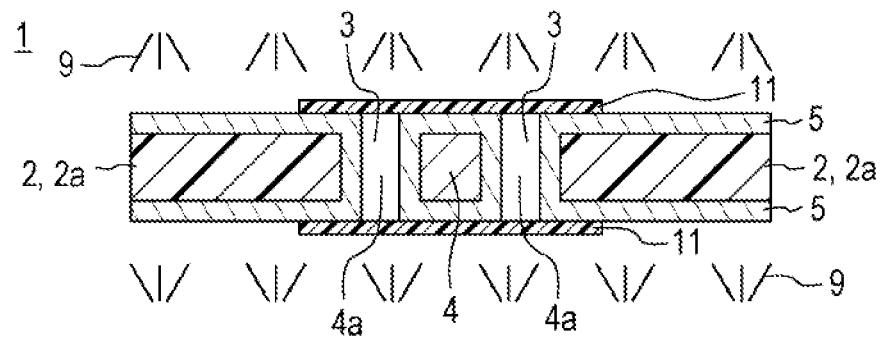
FIGS. 2A to 2D each are an explanatory diagram illustrating in time series a part of a process included in a method of manufacturing a through hole of a substrate according to the embodiment.
Figure 4:
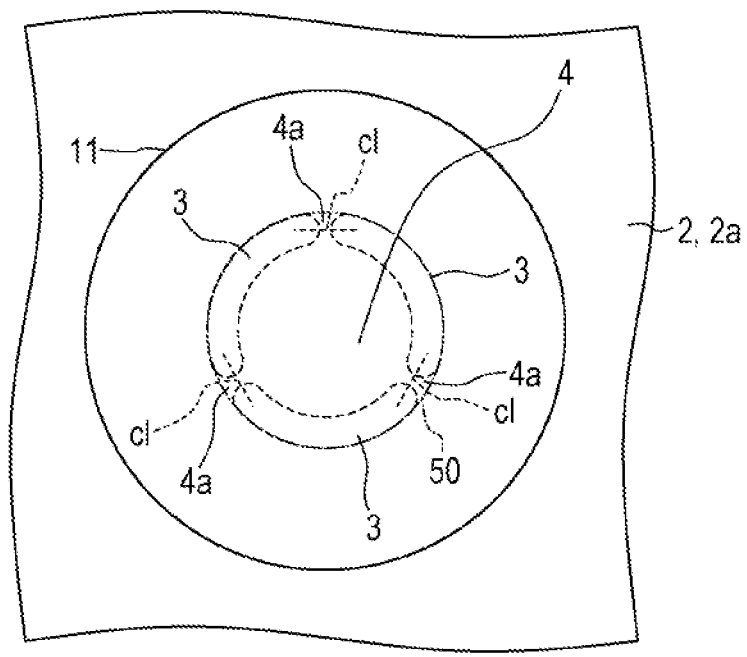
FIG. 4 is a plan view illustrating an etching resist covering the contour hole.

After performing the exposure, as illustrated in FIG. 2A, development of the dry film 6 is performed using a developing liquid 9 and an etching resist 11 is formed. With reference to FIG. 4, the etching resist 11 covering the opening of the contour hole 3 will be described. The etching resist 11 covers the opening of the contour hole 3 but, at a part other than the opening of the contour hole 3, is supported by the removal target part 4 and the remaining part 2a. That is, an area of the etching resist 11 covering a space part is larger than an area surround by the contour line 50 that forms the through hole 13 eventually, for example.

Figure 2B:
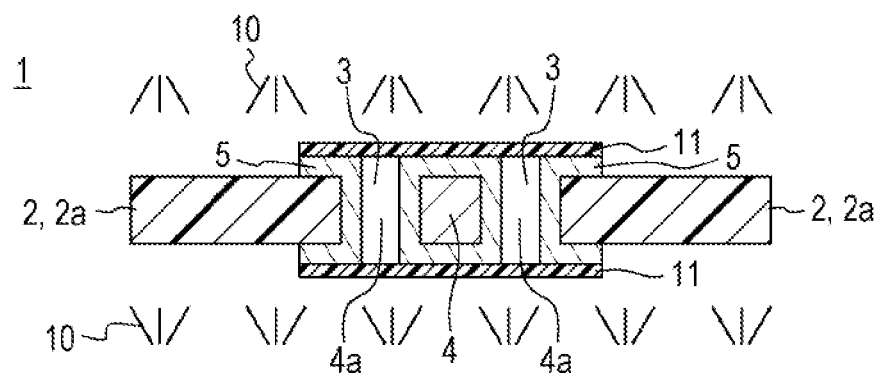

After the etching resist 11 is formed, as illustrated in FIG. 2B, etching is performed using the etching liquid 10 to remove an unwanted part of the plating 5. In the present embodiment, the opening of the contour hole 3 is covered by the etching resist 11, the plating 5 applied to the inside of the contour hole 3 also remains.

Figure 5A:
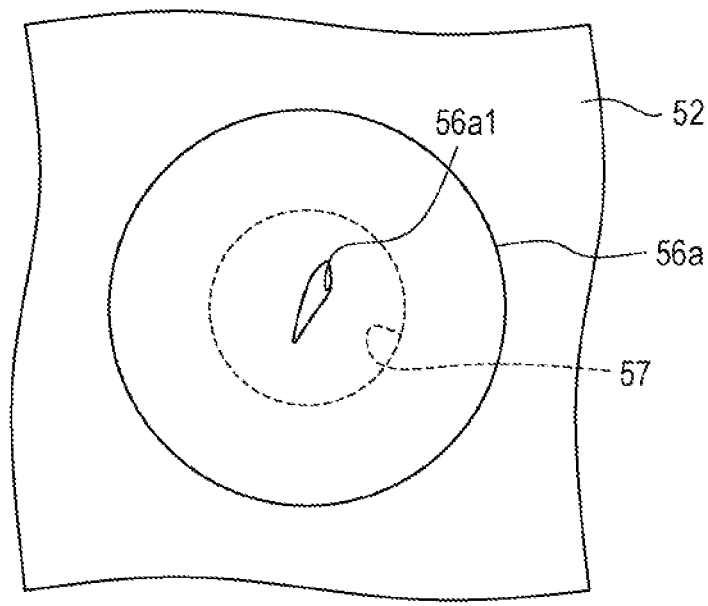
FIG. 5A illustrates a state in which ad film covering a through hole of a comparative example is damaged.
Figure 5B:
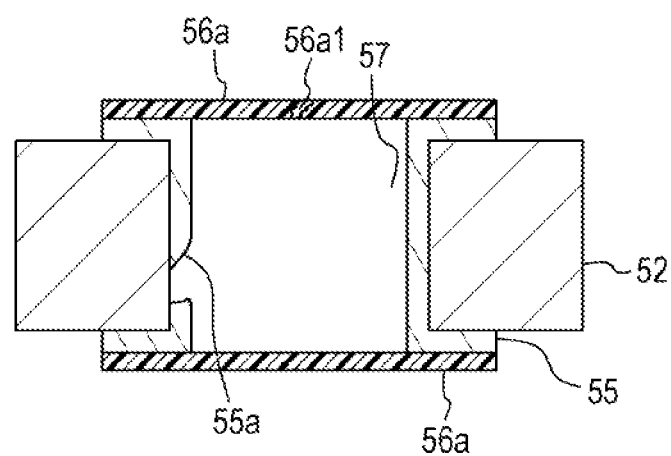
FIG. 5B is an explanatory diagram schematically illustrating a state in which an etching liquid enters through the damaged dry film to cause damage of through hole plating.

With reference to FIGS. 5A and 5B, an etching resist 56a provided with a base material 52 in a comparison example will be described. The etching resist 56a in the comparison example is different from that in the present embodiment and is not supported by the inside of a through hole 57, possibly causing a breakage 56a1 thereon. The more the diameter of the through hole 57 is, the more easily the breakage 56a1 occurs. When the breakage 56a1 has occurred, an etching liquid enters into the through hole 57 through the breakage 56a1, and as illustrated in FIG. 5B, a damage 55a of a through hole plating 55 may be caused.

In contrast, according to the present embodiment, the etching resist 11 is hard to be broken and the plating 5 applied in the contour hole 3 is not damaged, suppressing generation of a damage.

Figure 2C:
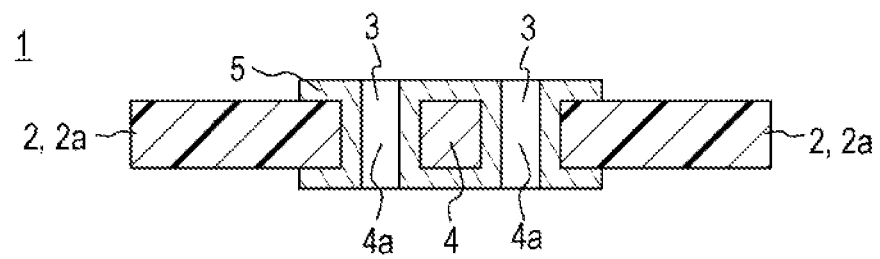
Figure 2D:
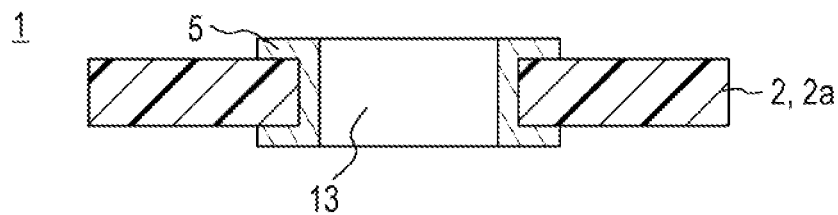
Figure 6A:
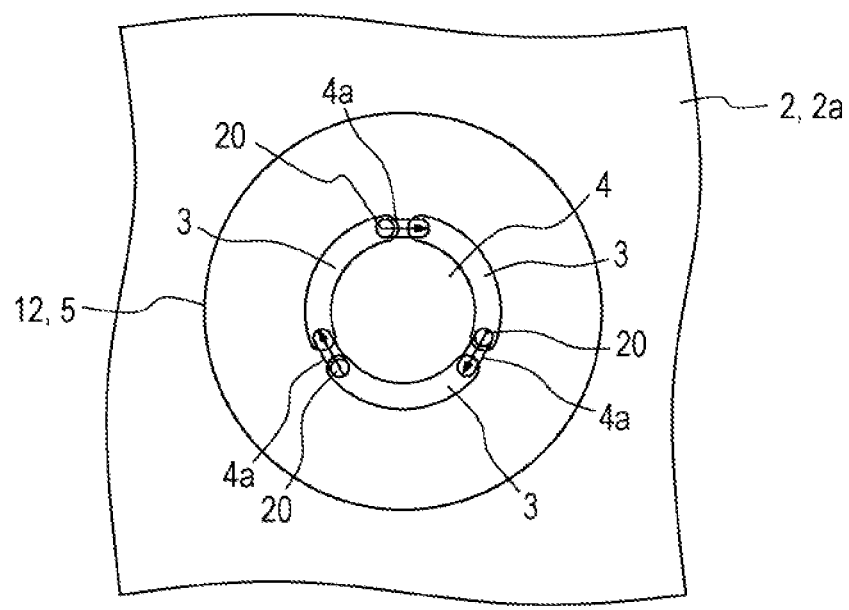
FIG. 6A is an explanatory diagram schematically illustrating a state in which a connection part is cut.
Figure 6B:
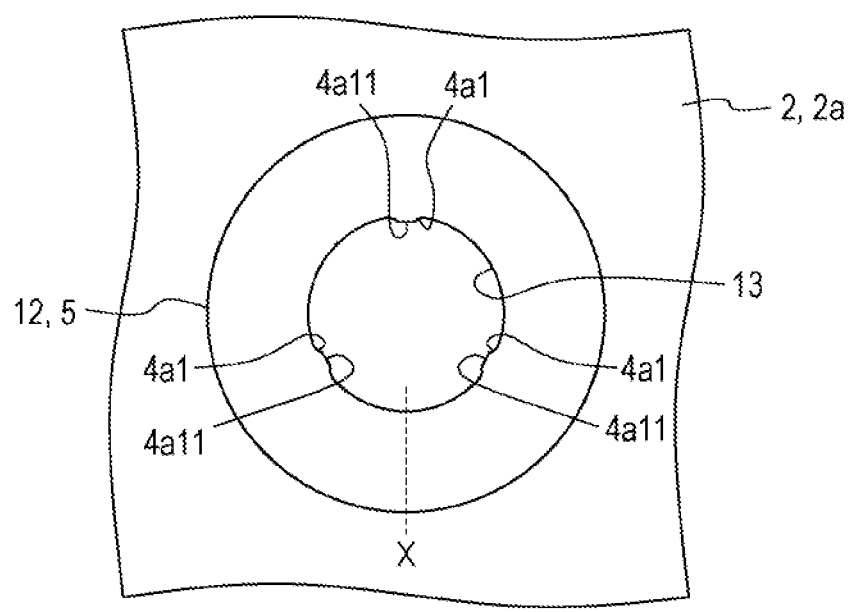
FIG. 6B is a plan view illustrating a state in which a removal target part has been removed and a through hole has been formed.

After etching is completed, as illustrated in FIG. 2C, the etching resist 11 is removed. As illustrated in FIG. 2D, the removal target part 4 is removed. With reference to FIGS. 4, 6A, and 6B, a process in which the connection part 4a is cut and the removal target part 4 is removed will be described.

In FIG. 4, a dotted line passing the connection part 4a illustrates a cutting line cl. The cutting line cl is set to pass a substantially intermediate point between the removal target part 4 and the remaining part 2a. When the connection part 4a is cut, as illustrated in FIG. 6A, a reamer is used. At this point, the center of a trajectory 20 of the reamer is to pass over the cutting lime cl. The tool used for the cutting is not limited to a reamer, and a router or a drill may be used. The removal target part 4 may be removed by punching working such as punching press.

As described above, by cutting the connection part 4a, the removal target part 4 may be removed to form the through hole 13, as illustrated in FIG. 6B. With this, the circuit board 1 may be obtained. In the inside of the through hole 13 of the circuit board 1, the plating 5 remains and forms a conductor circuit 12.

Figure 7:
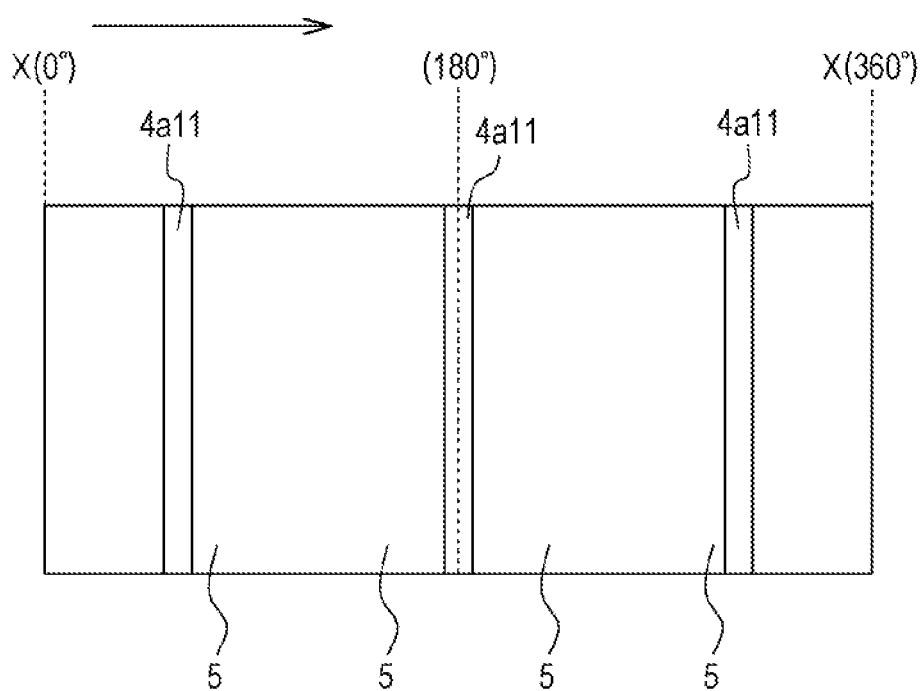
FIG. 7 is an explanatory diagram of an area ratio of plating inside the through hole.

On the inner peripheral wall face of the through hole 13 thus formed, a projection part 4a1 remains in the position in which the connection part 4a had been provided. On a cut face 4a11 remaining on this projection part 4a1, the plating 5 is not applied, but on parts other than that, the plating 5 is applied. With reference to FIG. 7, an area ratio of plating inside the through hole 13 will be described. FIG. 7 schematically illustrates a state in which the through hole 13 is exploded with a point X in FIG. 6B as a starting point. In the present embodiment, three connection parts 4a had been provided at equal intervals, and thus, three cut faces 4a11 are formed at equal intervals. In the inner peripheral wall face of the through hole 13, parts other than these cut faces 4a11 are applied with the plating 5. Accordingly, in the present embodiment, in the area of the inner peripheral wall face of the through hole 13, an area excluding the areas of the three cut faces 4a11 corresponds to the ratio of the area of plating in the inside of the through hole 13.

Into the through hole 13, an electronic part provided with a terminal may be inserted. However, the through hole 13 is applied with the plating 5 over a wide range thereof, good electric conductivity may be secured.

The smaller the number of the connection parts 4a is, the larger the ratio of the area of plating in the inside of the through hole 13 may be set. To make the number of the connection parts 4a smaller, it is effective to make a long groove for the contour hole 3.

As described above, according to the present embodiment, damage of the etching resist 11 may be avoided and damage of the plating 5 in the inside of the through hole 13 may be suppressed. The ratio of the area of plating in the inside of the through hole 13 may be improved.

According to the present embodiment, materials including manufacturing equipment, a dry film, plating, a photomask, and an etching liquid that are used for a method conventionally used may be adopted. With this, new equipment or materials do not have to be prepared and a large-sized through hole may be formed at less cost.

First Modification

Figure 8A:
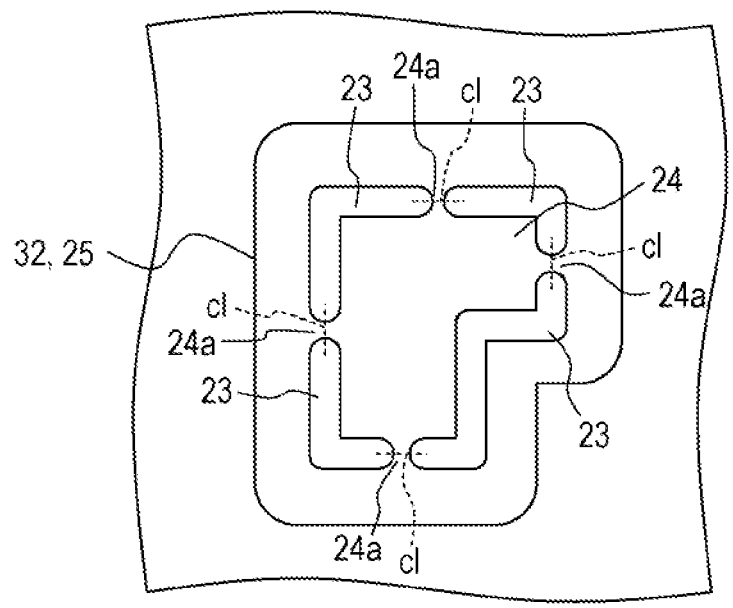
FIG. 8A is an explanatory diagram illustrating a periphery of a removal target part in an example in which the shape of a through hole is not round.
Figure 8B:
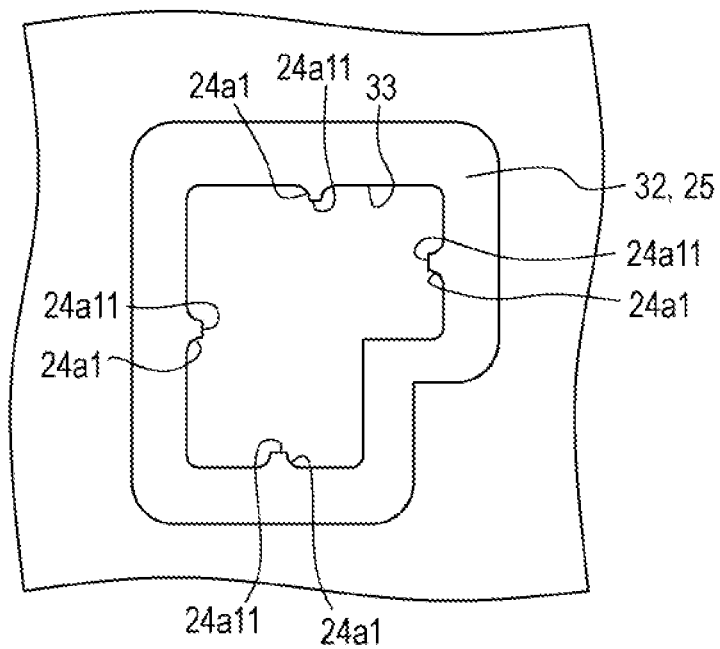
FIG. 8B is a plan view illustrating a through hole that is not round.

With reference to FIGS. 8A and 8B, a first modification will be described. The through hole 13 in the above-described embodiment is substantially round. In contrast, in the modification illustrated in FIGS. 8A and 8B, a through hole 33 having a shape formed by combining large and small rectangles is formed.

In this first modification, similarly to the above-described embodiment, a plurality of contour holes 23 surrounding a removal target part 24 are formed. At this point, a connection part 24a remains between the contour holes 23 adjacent to each other. A process in which plating 25 is applied, a process in which a dry film covering the opening of the contour hole 23 is applied, exposure and development are performed, and an etching resist is formed, a process in which etching of the plating 25 is performed, and a process in which the etching resist is removed are performed. The connection part 24a is cut along the cutting line cl and the removal target part 24 is removed, so as to form the through hole 33 applied with the plating 25 forming a conductor 32. In this case also, as illustrated in FIG. 8B, the plating 25 is not applied on a cut face 24a11 remaining on a projection part 24a1. However, parts other than that are applied with the plating 25. Accordingly, the ratio of the area of plating in the inside of the through hole 33 is large.

As described above, by using the same method as in the embodiment, various shapes of through holes may be formed. That is, according to the method in the embodiment, a through hole may be formed without limitation related to the shape or the size, for example.

Second Modification

Figure 9A:
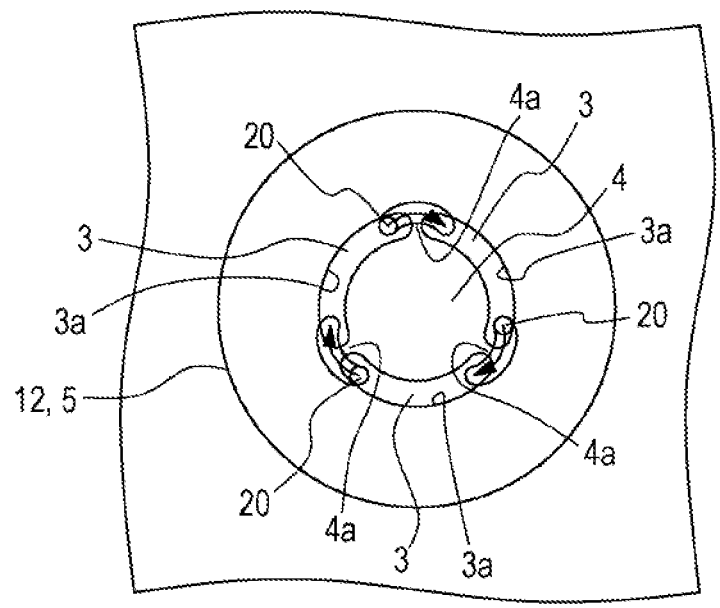
FIG. 9A is an explanatory diagram schematically illustrating a state in which the connection part is cut in a position apart from the removal target part.
Figure 9B:
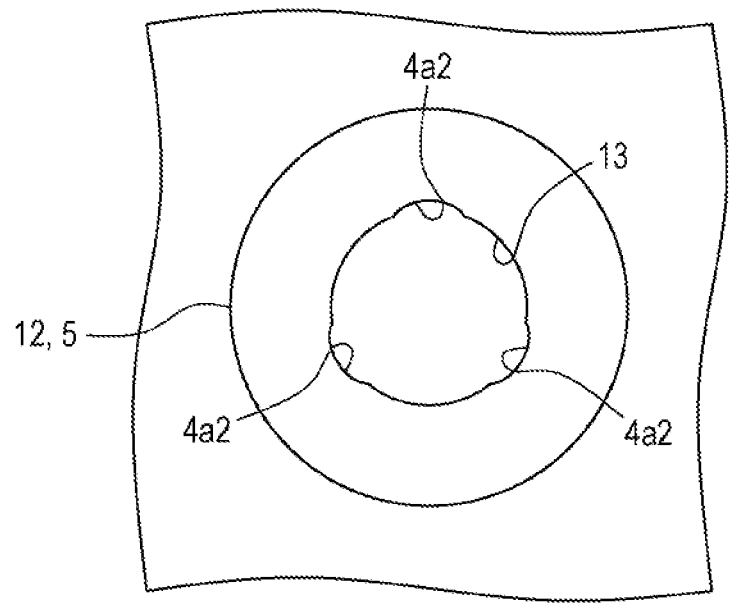
FIG. 9B is a plan view illustrating a state in which the removal target part has been removed and a through hole has been formed.

With reference to FIGS. 9A and 9B, a second modification will be described. In the above-described embodiment, the projection part 4a1 is provided that projects toward the inside of the through hole 13 formed after the removal target part 4 is removed, as illustrated in FIG. 6B. It sometimes is convenient that this projection part 4a1 may be processed in an appropriate manner when it is assumed that an electronic part or the like is attached to the through hole 13. For this reason, as illustrated in FIG. 9A, the connection part 4a is cut at an outer side from the outer edge (inner peripheral wall face of the contour hole 3 applied with plating) 3a. With this, as illustrated in FIG. 9B, a cut face 4a2 appearing after the connection part 4a is cut may be formed on the inner peripheral wall face of the contour hole 3 applied with plating, that is, at an outer side from the inner peripheral wall face of the through hole 13, for example. This enables to make the through hole 13 in a state in which no projection part is formed.

Other Modification

Figure 10A:
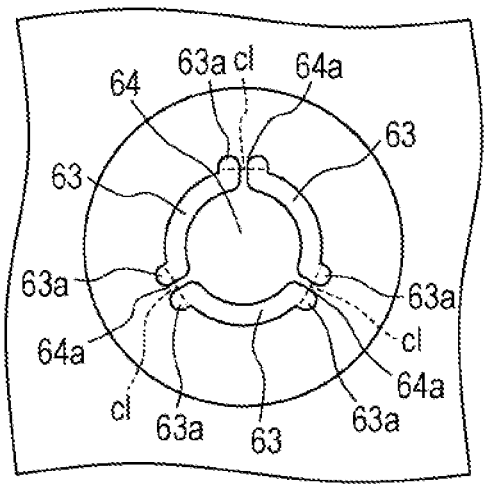
FIG. 10AA is an explanatory diagram illustrating an example in which an end part of the contour hole is bent toward the side apart from the removal target part.

With reference to FIGS. 10AA to 10BC, other modifications will be described. These each illustrate an example in which an end part of the contour hole which is a slot is bent toward the side apart from a removal target part.

Figure 10B:
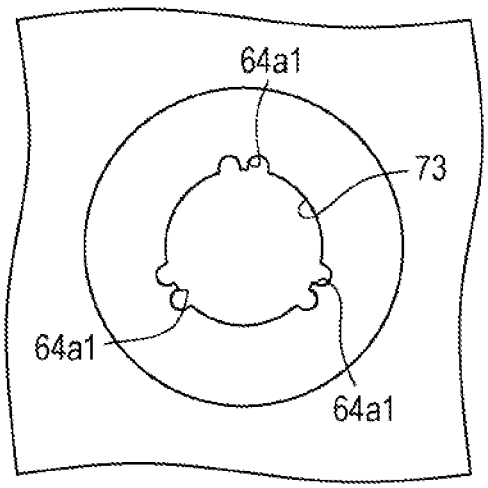
FIG. 10BA is an explanatory diagram illustrating a state in which the removal target part has been removed from the state illustrated in FIG. 10AA and a through hole has been formed.
Figure 10A:
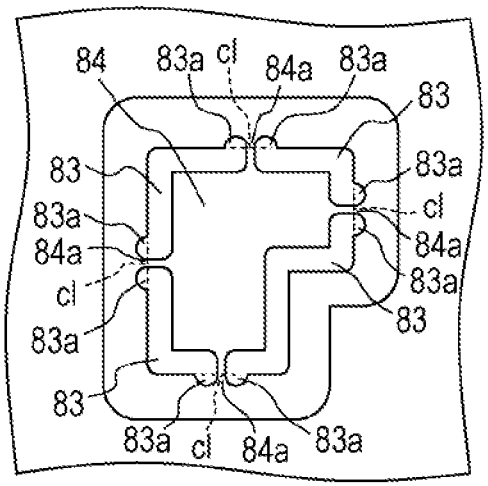
Figure 10B:
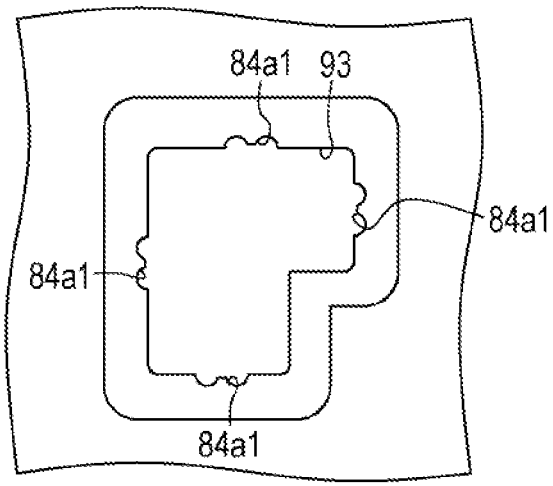
Figure 10A:
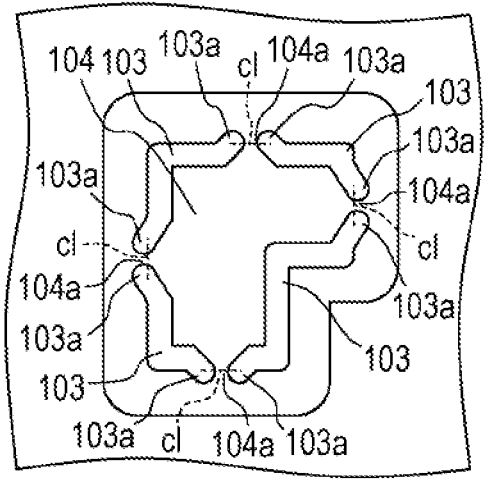
Figure 10B:
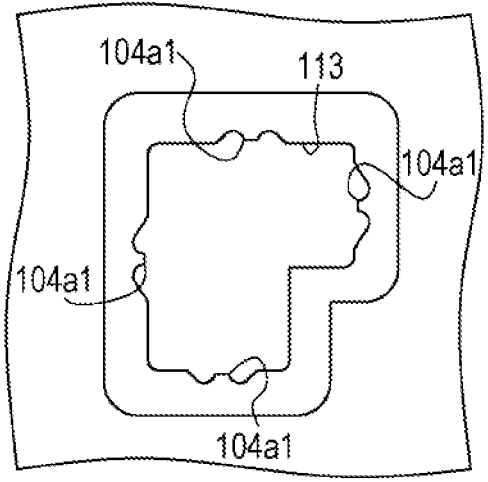

As illustrated in FIG. 10AA, a contour hole 63 being a long groove surrounding a removal target part 64 is provided. At this time, an end part 63a of the contour hole 63 is bent toward the side apart from the removal target part 64. With this, the connection part 64a is formed at the side apart from the removal target part 64. When this connection part 64a is cut at the cutting line cl, as illustrated in FIG. 10BA, the top of the projection part 64a1 does not protrude to the inside of a through hole 73.

As illustrated in FIG. 10AB, a contour hole 83 being a long groove surrounding a removal target part 84 is provided. At this time, an end part 83a of the contour hole 83 is bent toward the side apart from the removal target part 84.

With this, the connection part 84a is formed at the side apart from the removal target part 84. When this connection part 84a is cut at the cutting line cl, as illustrated in FIG. 10BB, the top of the projection part 84a1 does not protrude to the inside of a through hole 93.

As illustrated in FIG. 10AC, a contour hole 103 being a long groove surrounding a removal target part 104 is provided. At this time, an end part 103a of the contour hole 103 is diagonally bent toward the side apart from the removal target part 104. With this, the connection part 104a is formed at the side apart from the removal target part 104. When this connection part 104a is cut at the cutting line cl, as illustrated in FIG. 10BC, the top of the projection part 104a1 does not protrude to the inside of a through hole 113.

Figure 11A:
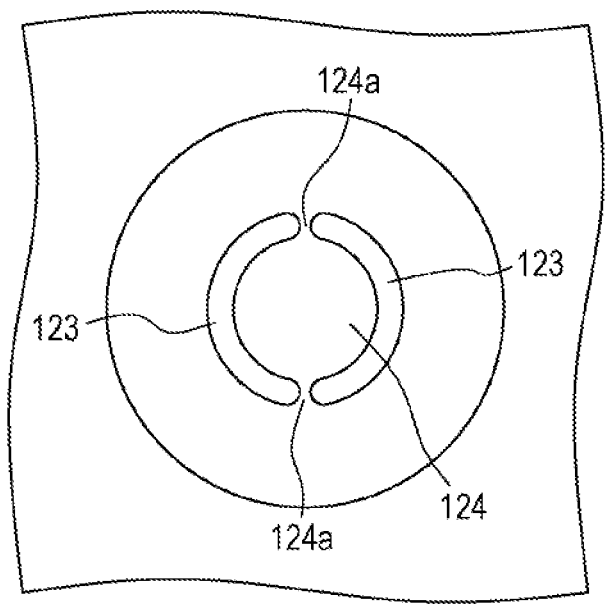
FIG. 11A is an explanatory diagram illustrating an example in which two connection parts are provided.
Figure 11B:
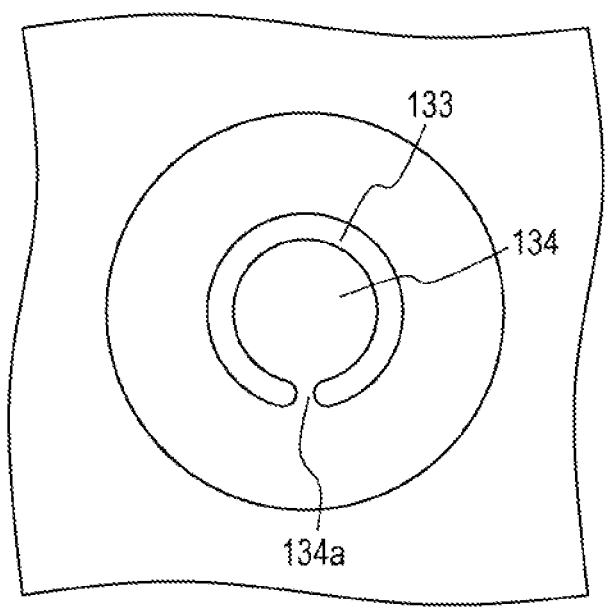
FIG. 11B is an explanatory diagram illustrating an example in which one connection part is provided.

As described above, according to the method of manufacturing a through hole of a substrate according to the present embodiment, a contour hole is provided and an etching resist covering the opening of this contour hole is formed, enabling to suppress damage of the etching resist (dry film). In the through hole, a part other than the cut face of a connection part is applied with plating, enabling to improve the ratio of the area of plating in the inside of the through hole. To improve the ratio of the area of plating in the inside of the through hole, the number of connection parts is desirably reduced. For example, as illustrated in FIG. 11A, two contour holes 123 surrounding a removal target part 124 is formed. With this, the number of connection parts 124a may be two, enabling to improve the ratio of the area of plating in the inside of the through hole. As illustrated in FIG. 11B, one contour hole 133 surrounding substantially the entire area of a removal target part 134 is provided, enabling to provide one connection part 134a. However, in this form, in a working process, the removal target part 134 easily moves and the connection part 134a is possibly broken. For this reason, at least two connection parts desirably remain.

Figure 12A:
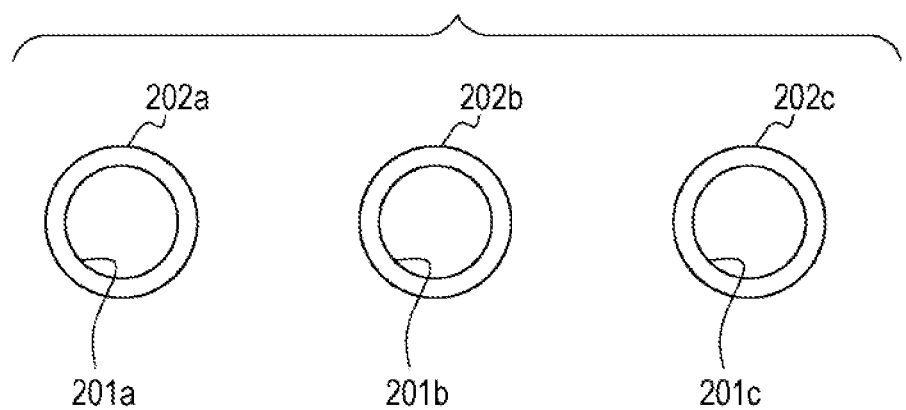
FIG. 12A is an explanatory diagram illustrating a round hole formed with a conventional method of manufacturing a through hole.
Figure 12B:
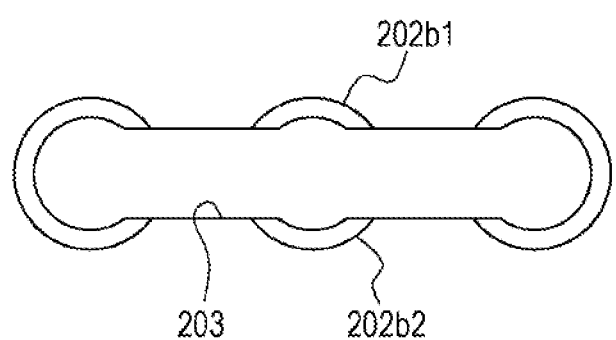
FIG. 12B is an explanatory diagram illustrating a state in which a slot connecting the round holes is provided to form a slot through hole.

As described above, the method of manufacturing a through hole of a substrate according to the present embodiment may achieve various effects. The effects will be further described in comparison with a conventional example. FIG. 12A is an explanatory diagram illustrating a round hole formed with a conventional method of manufacturing a through hole. FIG. 12B is an explanatory diagram illustrating a state in which a slot connecting the round holes is provided to form a slot through hole. In the conventional example, a round hole 201a applied with plating 202a, a round hole 201b applied with plating 202b, and a round hole 201c applied with plating 202c are provided. These round holes 201a to 201c are connected with a slot 203. In the through hole thus created, plating is applied to parts that used to form the round holes 201a to 201c. Accordingly, the ratio of the area of plating in the inside of the through hole is small. Edges 202b1 and 202b2 facing each other at the center of the through hole both used to form the round hole 201b. That is, if making the size of the through hole large, the diameter of the round hole has to be large, causing an inconvenience, for example. The shape of the through hole will be a shape in which round holes are connected, causing a great limitation related to the final shape.

Compared with this comparison example, the method of manufacturing a through hole of a substrate according to the present embodiment enables to make the ratio of the area of plating in the inside of the through hole large and achieve great flexibility related to the shape of the through hole.

A preferred embodiment of the present disclosure has been described above. However, the present disclosure may not be limited to this specific embodiment, and various modifications and changes may be made within the scope of the present disclosure described in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a through hole of a substrate, comprising:
    forming in the substrate a cutting hole surrounding a removal target part such that a connection part between the substrate and the removal target part remains along a cutting line defining the through hole to be formed in the substrate, the removal target part being a portion of the substrate;
    applying plating on an area including an inner peripheral wall face of the cutting hole of the substrate;
    applying a film covering an opening of the cutting hole on a surface of the substrate applied with the plating and performing exposure and development of the film to form an etching resist covering an area including the opening of the cutting hole;
    etching the plating applied on the substrate;
    removing the etching resist; and
    cutting the connection part to remove the removal target part.

2. The method according to claim 1,
    wherein the connection part includes a plurality of connection parts and,
    at least two of the plurality of connection parts remain in the forming the cutting hole in the substrate.

3. The method according to claim 1,
    wherein the cutting hole is a slot.

4. The method according to claim 3,
    wherein an end part of the slot is bent toward a side apart from the removal target part.

5. The method according to claim 1,
    wherein a cut face appearing after the connection part is cut is formed at an outer side from the inner peripheral wall face of the cutting hole applied with the plating.

* * * * *